United States Patent
Nealis et al.

(12) 
(10) Patent No.: US 6,301,123 B1
(45) Date of Patent: Oct. 9, 2001

(54) BOARD EXTRACTOR CATCH FOR A CARD MODULE

(75) Inventors: Edwin John Nealis, Cary; Quentin Scott Denzene, Apex, both of NC (US)

(73) Assignee: Ericsson INC, Research Triangle Park, NC (US)

( * ) Notice: Subject to any disclaimer, the term of this patent is extended or adjusted under 35 U.S.C. 154(b) by 0 days.

(21) Appl. No.: 09/282,517

(22) Filed: Mar. 31, 1999

(51) Int. Cl.[7] ........................................ H05K 7/14
(52) U.S. Cl. ..................... 361/798; 361/740; 361/752; 361/759
(58) Field of Search ........................... 361/727–730, 361/740, 752, 753, 759, 798

(56) References Cited

U.S. PATENT DOCUMENTS

| 3,180,670 | | 4/1965 | Pryde . |
|---|---|---|---|
| 3,583,744 | | 6/1971 | Paine . |
| 3,636,413 | * | 1/1972 | Ditthardt et al. .................... 361/326 |
| 4,096,548 | * | 6/1978 | Misono et al. ........................ 361/755 |
| 4,547,835 | * | 10/1985 | Pansaert et al. ..................... 361/399 |
| 5,457,607 | * | 10/1995 | Carvalho .............................. 361/740 |

FOREIGN PATENT DOCUMENTS

| 04158599 | 6/1992 | (EP) . |
|---|---|---|
| 1056276 | 2/1998 | (EP) . |
| 2234766A | 2/1991 | (GB) . |

* cited by examiner

*Primary Examiner*—Jeffrey Gaffin
*Assistant Examiner*—Tuan Dinh
(74) *Attorney, Agent, or Firm*—Coats & Bennett

(57) ABSTRACT

A card module includes a circuit board with a front panel secured along one edge, and a board extractor catch mounted to the front panel. The front panel includes a keyhole. The board extractor catch mounts in the keyhole so that the board extractor catch completely covers the keyhole to prevent air flow through the keyhole. The outer end of the board extractor catch includes a tool-receiving opening to engage a board extracting tool.

10 Claims, 6 Drawing Sheets

BOARD EXTRACTOR CATCH FOR A CARD MODULE

FIELD OF THE INVENTION

The present invention relates to outdoor cabinets for telecommunications switching equipment, and more particularly, to a card module for a telecommunications switching cabinet having means to extract the card module.

BACKGROUND OF THE INVENTION

Telecommunications equipment is typically designed for indoor temperature controlled environments, but is now frequently deployed in outdoor locations. When telecommunications equipment is deployed in outdoor locations, a cabinet is used to provide environmental protection and to control thermal conditions within the cabinet. The electronic equipment is generally contained in one or more removable card modules that plug into a backplane in the cabinet. The card modules are supported in the cabinet by a subrack and include connectors that mate with corresponding connectors on the backplane. Air flows through the subrack between the card modules to heat and/or cool the electronics on the card modules.

Card modules are usually installed and removed by using) a board extraction tool. The board extraction tool fits into a keyhole in the face panel of the card module and is rotated to engage the card. Once the card is engaged, the card can be pulled from its slot in the subrack without damaging adjacent card modules.

The presence of the keyhole in the card module presents a problem when the switching cabinet is deployed in an outdoor location. Air flow through the subrack leaks through the keyhole into the interior of the cabinet thereby reducing heating and cooling efficiency. The keyhole also allows ambient air to enter the protected space inside the subrack. The ambient air may carry contaminants that could be harmful to the equipment within the cabinet.

Previous solutions to this problem include covering or filling the keyhole with tape or fillers. These solutions are not adequate because they do not allow for a board extracting tool to be inserted into the keyhole for removing the PC board. Replaceable fillers or plugs have also been used which cover the hole and may be removed to insert the board extracting tool. When the filler is removed from the keyhole, the replaceable fillers or plugs are sometimes lost or damaged and, therefore, not placed back into the keyhole. Another drawback of keyhole plugs is they are expensive to manufacture or time consuming to install and remove. Both of these criteria result in the keyhole being left open as the user will chance damage to the PC board because the solution is too expensive or creates too much work and is too aggravating for use.

SUMMARY OF THE INVENTION

A card module for a telecommunication switching cabinet includes a circuit board with a front panel secured along one edge, and a board extractor catch mounted to the front panel. The front panel includes a keyhole. The board extractor catch mounts in the keyhole so that the board extractor catch completely covers the keyhole to prevent air flow through the keyhole. The board extractor catch includes a first end that butts against the front panel to cover the keyhole and a second end with a tool-receiving opening to engage a board extracting tool. The tool-receiving opening includes a central bore that extends generally parallel to the longitudinal axis of the board extractor catch, and a pair of L-shaped slots disposed on opposing sides of the central bore. The central bore extends through the catch element from the second end to the first end. A portion of the central bore adjacent the first end is internally threaded to engage with a threaded fastener.

The L-shaped slots include an insertion channel extending from the end of the catch element approximately one-half the distance of the catch element and a catch area. The board extracting tool is inserted into the tool-receiving opening with the pins on the tool aligned with the insertion channels and then rotated to engage the pins in the catch area.

The catch element also preferably includes one or more keys that engage with the keyhole to prevent the catch element from rotating. The catch element is held in place by a threaded fastener that extends through the front panel from the back and threads into the central bore of the catch element.

DETAILED DESCRIPTION OF THE INVENTION

In the following description, like-referenced characters designate like or corresponding parts throughout the several views. Also in the following description, it is to be understood that such terms as "forward," "rearward," "left," "right," and "upperly," "downwardly," and the like are words of convenience and are not to be construed as limiting terms.

Figure 1:
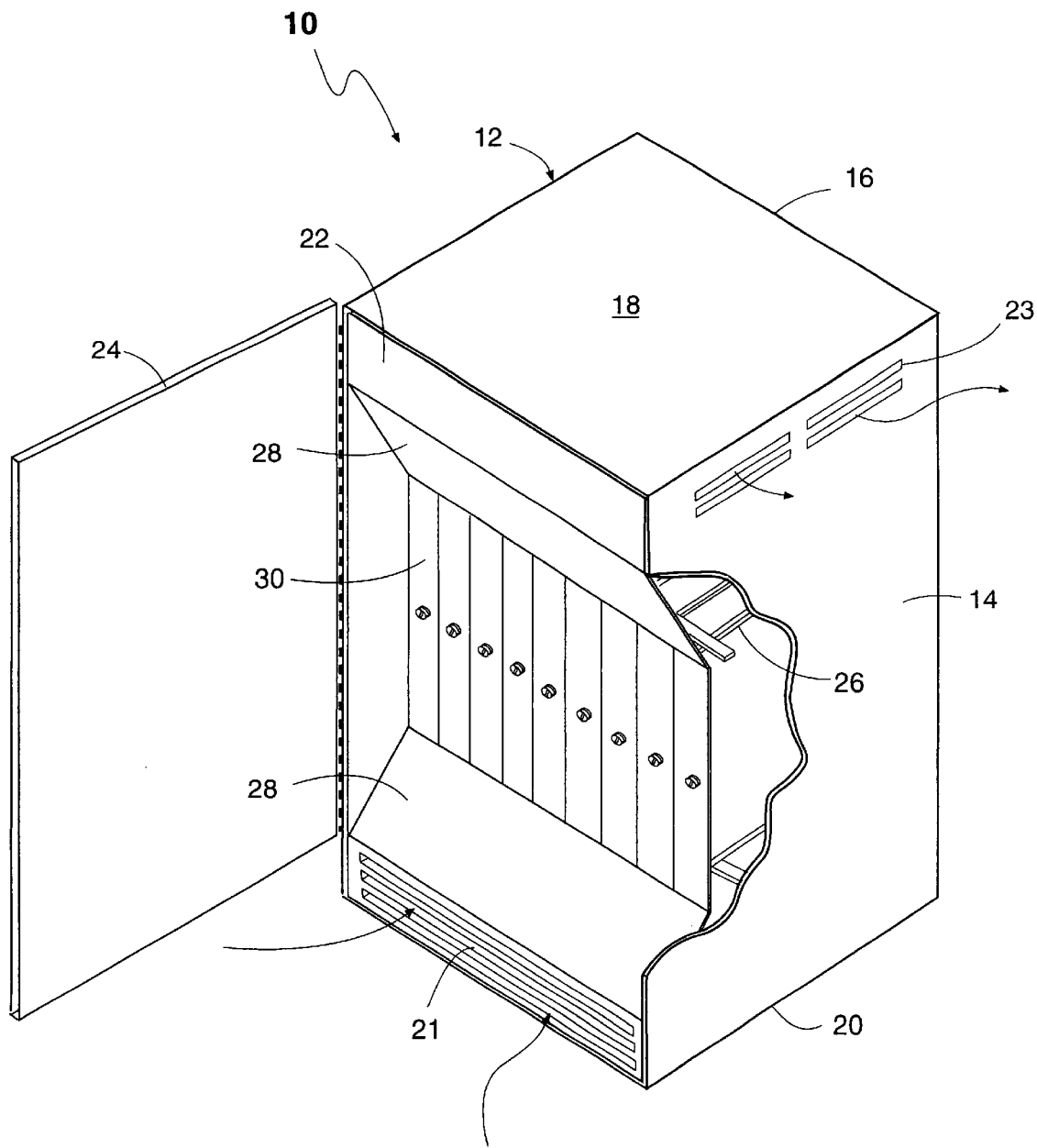
FIG. 1 is a perspective view of a switching cabinet constructed according to the present invention.

Referring now to the drawings in general, and FIG. 1 in particular, a switching cabinet, generally designated 10 is shown. The switching cabinet 10 comprises an enclosure 12 having side walls 14, a back wall 16, a top wall 18, and a bottom wall 20. The front 22 of the cabinet 10 is open. An access door 24 is mounted by a hinge (not shown) to one of the side walls 14 to permit access into the cabinet 10. The cabinet 10 provides an enclosed, protected space for the equipment inside the cabinet 10.

A plurality of PC card modules 30 are mounted in a subrack 26 inside the cabinet 10. The card modules 30 are supported in the cabinet 10 by a subrack 26. Baffles 28 direct air through the subrack 26 to heat and cool the electronics contained on the card modules 30 in a manner well-known in the art.

Figure 2:
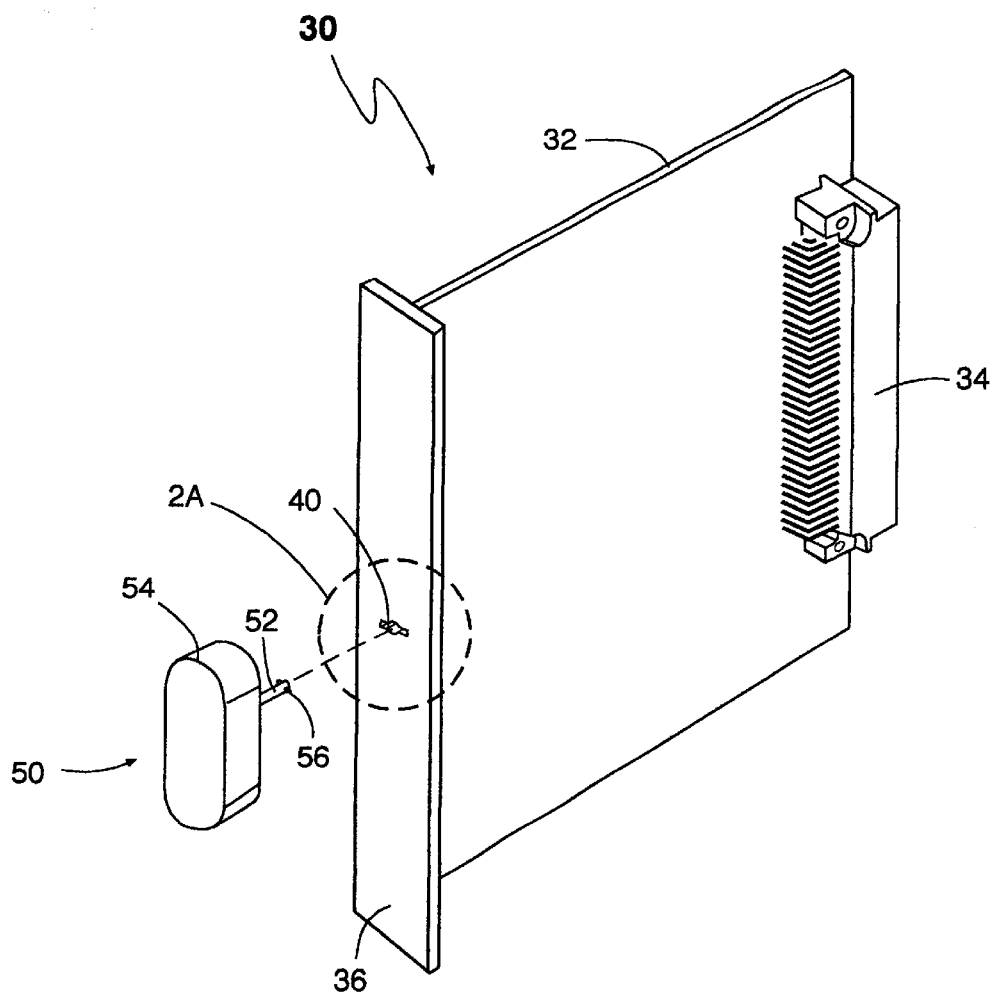
FIG. 2 is a perspective view of a PC card module having a board extracting tool inserted directly into the keyhole.
Figure 2A:
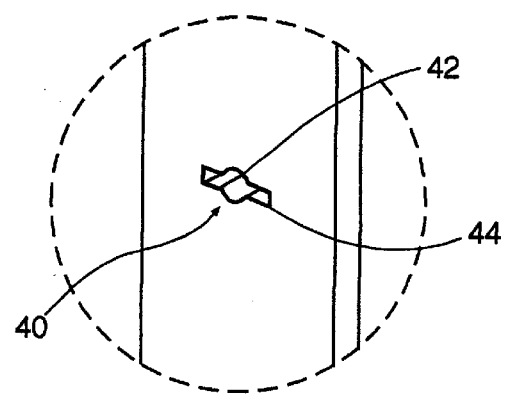
FIG. 2A is an enlarged view of the keyhole in a PC card module.

Each of the card modules 30, shown in FIG. 2, comprises a printed circuit board 32 containing electronic circuits. The printed circuit boards 32 have a connector 34 along the back edge of the circuit board 32 for connecting to a motherboard (not shown) in the back of the subrack 26. A front panel 36 is attached along a front edge of the circuit board 32. One function of the front panel 36 is to secure the card module within the subrack 26. As illustrated in FIG. 1, the front panels 36 of the adjacent PC card modules 30 abut together forming a continuous face. As the front panels 36 abut closely together, it is difficult to grasp the modules 30 to remove them from the subrack 26. To overcome this problem, each of the front panels 36 includes a keyhole 40 that is engaged by an extraction tool for removing the PC card modules 30 from the subrack 26. The keyhole 40 has a central opening 42 and keyways 44 extending outward from the central opening 42. A board extracting tool 50 is inserted into the keyhole 40 to remove the PC card module 30 from the subrack 26. The board extracting tool 50 includes a shaft 52 attached to a handle 54. The end of the tool 50 opposite the handle 54 includes pins 56. The pins 56 extend outward from the shaft 52. The end of the tool 50 is inserted into the keyhole 40 with the pins 56 aligned with the keyways 44. The tool 50 inserts through the central opening 42 so that the pins 56 align with and pass through the keyways 44 in the keyhole 40. Once inserted into the keyhole 40, the board extracting tool 50 is rotated approximately ninety degrees and pulled outward. When the board extracting tool is pulled outward, the pins 56 engage the backside of the front panel 36 pulling the card module 30 out of the subrack 26.

The temperature of the PC card modules 30 is controlled by air flow through the cabinet. As illustrated in FIG. 1, baffles 28 direct air flow from an air inlet 21 in the front 22 of the cabinet, through the subrack 26, to an air outlet 23 in one side of the cabinet 10. It is understood that the inlet 21 and outlet 23 may be positioned in a variety of orientations depending upon the specific application. This orientation provides for directing airflow through the subrack 26, including along and between the adjacent card modules 30. This orientation also reduces the amount of moisture droplets or other debris from entering into the cabinet 10 and the subrack 26.

Figure 3B:
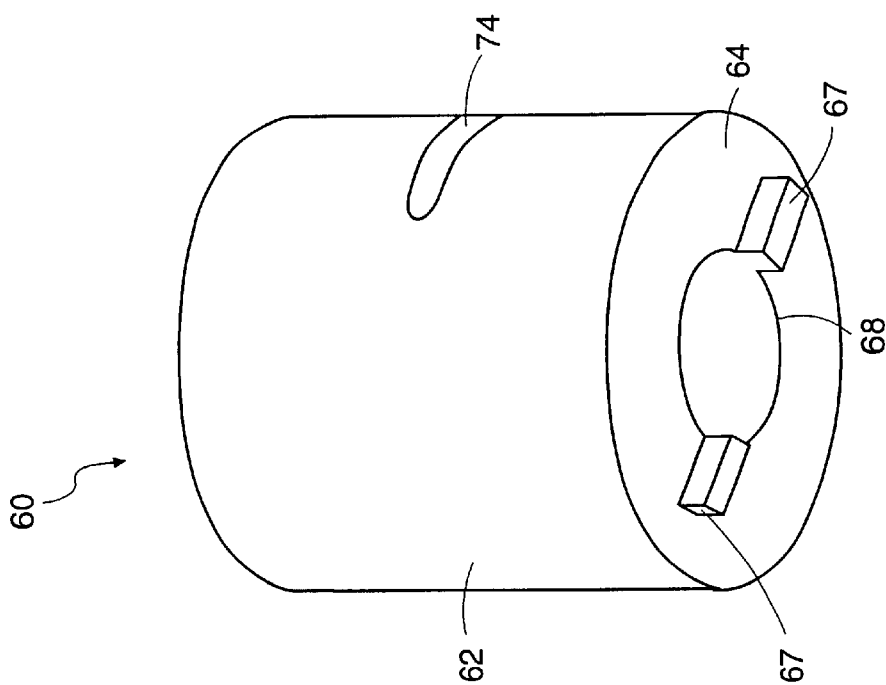
FIG. 3B is a perspective view the board extractor catch from the rear.
Figure 3A:
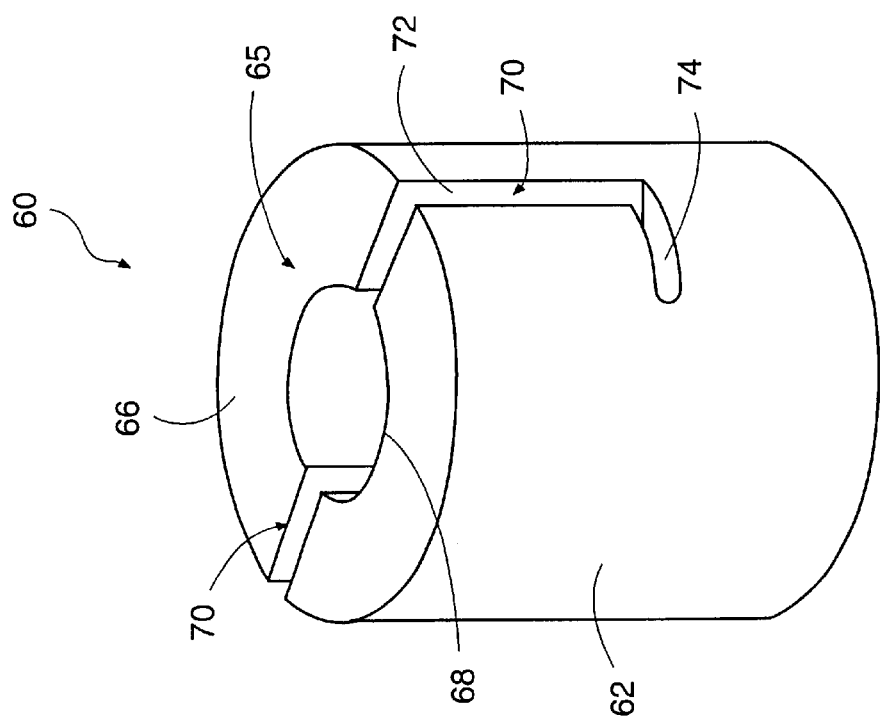
FIG. 3A is a perspective view of the board extractor catch from the front.
Figure 4:
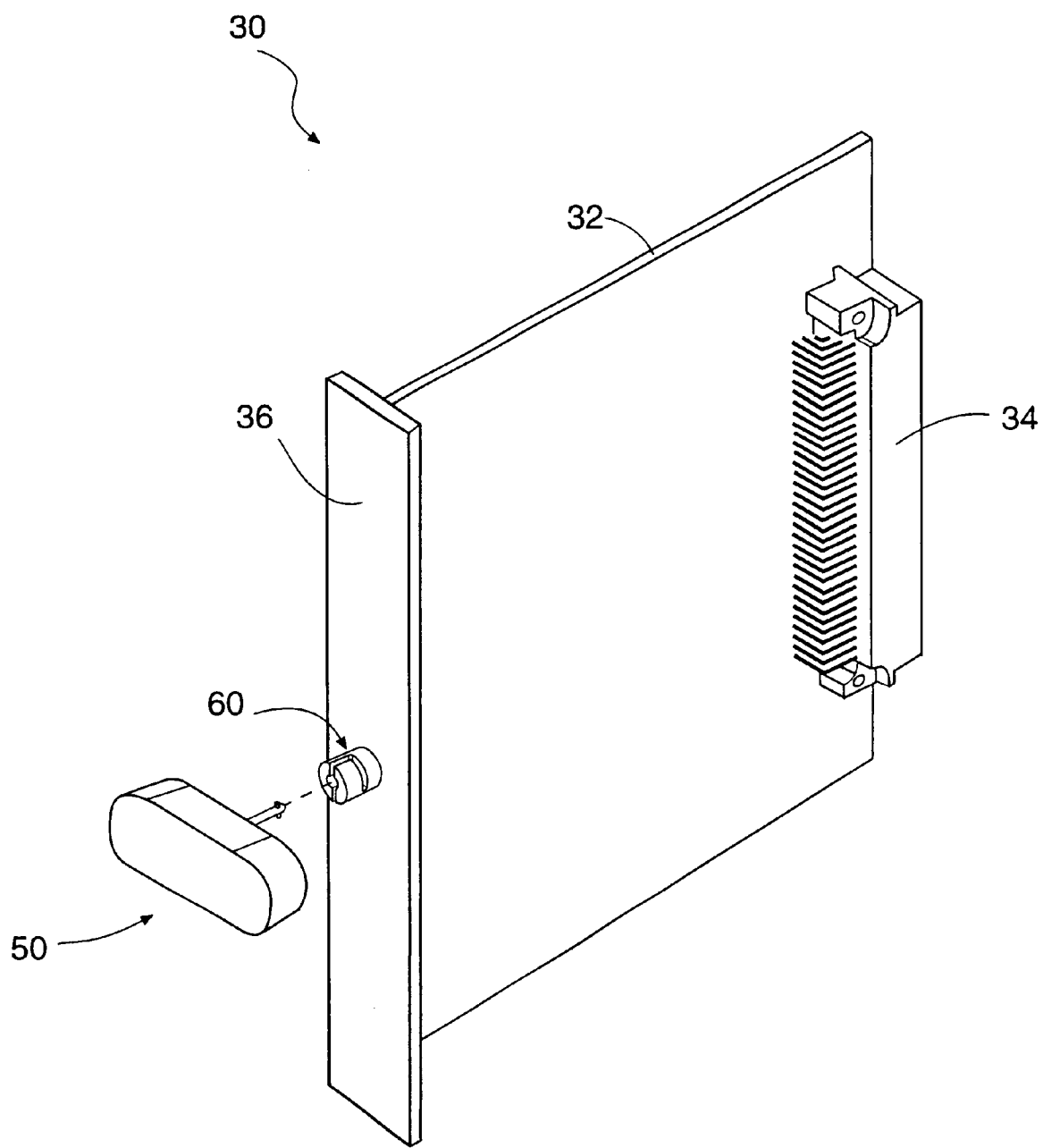
FIG. 4 is a perspective view illustrating the card module with the board extractor catch mounted to the front panel.

The keyholes 40 in the front panels 36 reduce the efficiency of the airflow by allowing air to enter or exit without circulating through the subrack 26. Additionally, moisture droplets or other debris may enter through the keyholes 40 and directly contact and damage the printed circuit boards 32. To overcome these problems, the card modules 30 of the present invention include a board extractor catch 60 as shown in FIGS. 3A and 3B. Catch 60 has a generally cylindrically shaped body 62 including a first end 64 which mounts against the panel 36 and a second end 66 which projects out from the panel 36. The diameter of the catch body is sufficient to completely cover the keyhole 40 when the catch 60 is mounted to the front panel 36. A tool-receiving opening 65 is formed in the second end 66 of the catch body 62. In the disclosed embodiment, the tool-receiving opening 65 comprises a central bore 68 that extends through the catch body 62 and two diametrically opposed, L-shaped slots 70. The central bore 68 preferably has a circular cross-section and extends from the second end 66 to the first end 64. A portion of the central bore 68 adjacent the first end is internally threaded to receive a screw or bolt as will be hereinafter described. In an alternative embodiment, separate bores that do not connect to one another could be formed in the first and second ends 64 and 66 respectively, instead of a single bore that extends the entire length of the catch body 62.

Slots 70 extend outward from the central bore 68. In the disclosed embodiment, the slots 70 extend to the perimeter of the catch body 62, though this is not essential. Slots 70 include an insertion channel 72 and a catch area 74. The insertion channel 72 extends from the second end 66 of the catch body 62 approximately one-half the length of the catch body 62. The catch area 74 extends from the bottom end of the insertion channel 72 circumferentially around the catch body 62.

Figure 5:
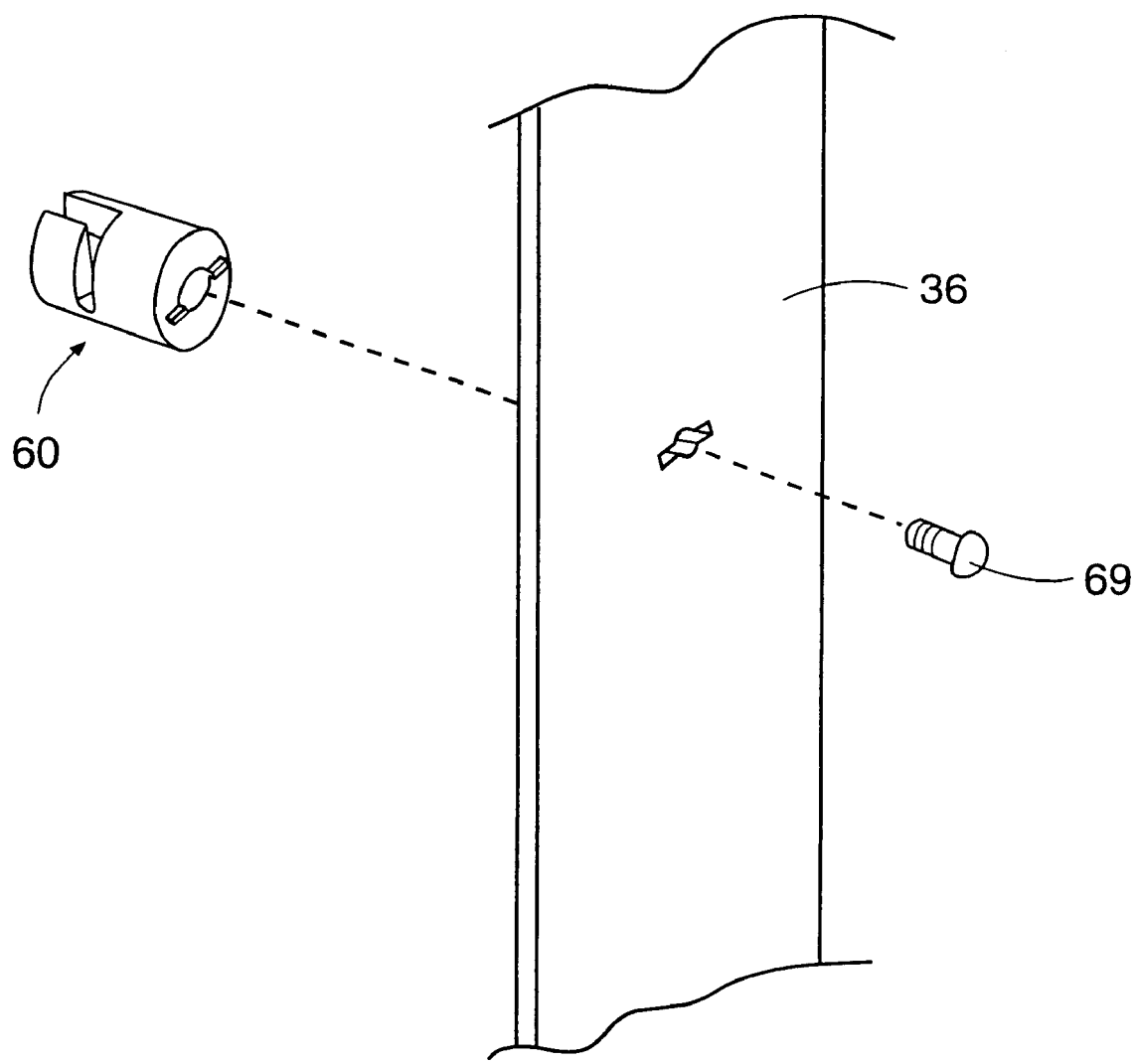
FIG. 5 is an exploded perspective view of a portion of the card module showing the mounting of the board extractor.
Figure 6:
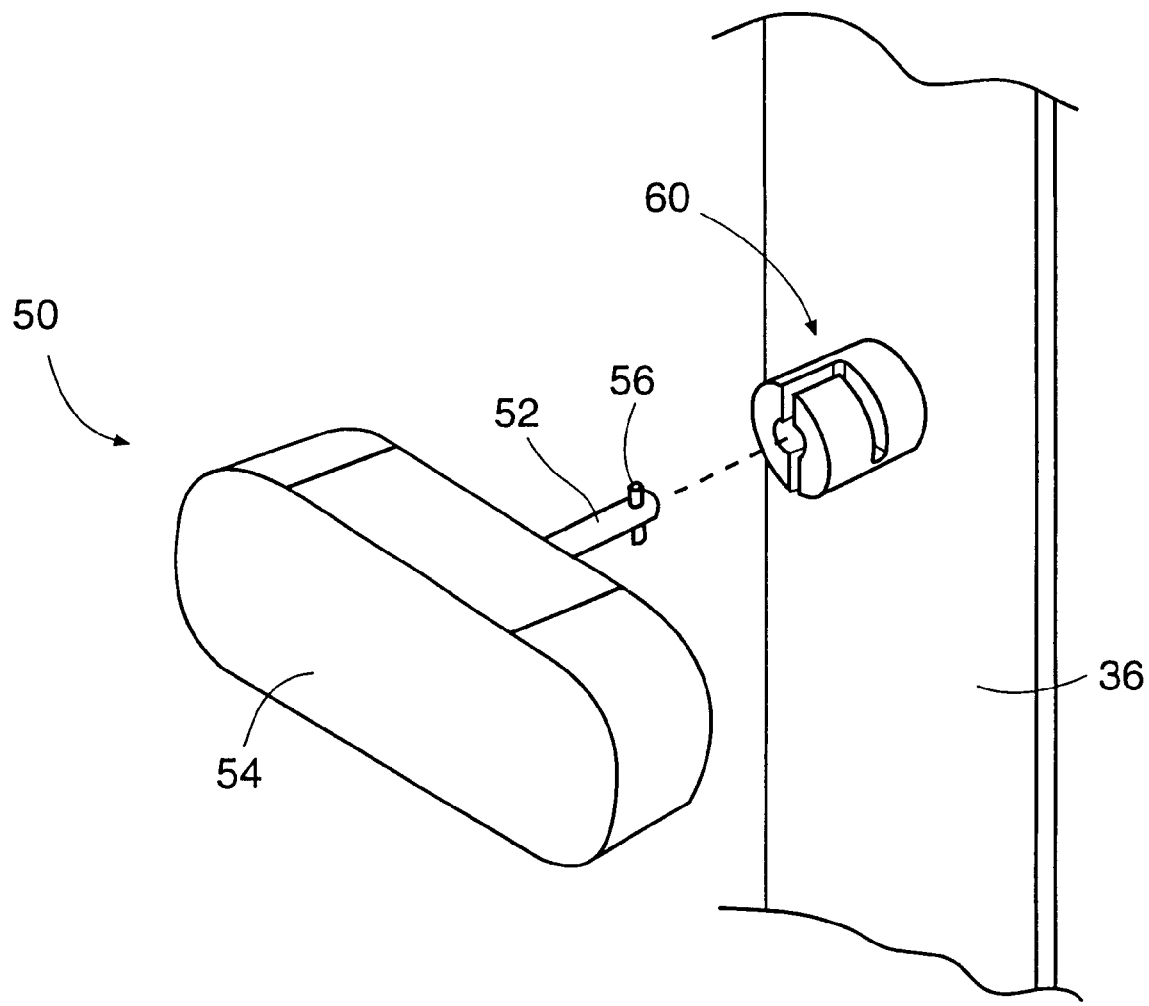
FIG. 6 is a detail perspective view of the board extractor catch being engaged by a board extracting tool.

The first end 64 of the catch 60 includes a pair of keys 67 disposed on opposite sides of the central bore 68. The keys 67 align with the keyways 44 in the keyhole 40 of the front panel 36. When the catch 60 is mounted to the front panel 36 of the card module 30, the keys 67 on the catch 60 fit into the keyways 44 to prevent rotation of the catch 60. The catch 60 is held in place by a threaded fastener 69 that screws into the central bore as shown in FIG. 5.

In use, the board extractor catch 60 is mounted onto the front panel 36 of the card module 30. The keys 67 extending from the first end 64 engage with the keyways 44 of the keyhole 40 to prevent rotation of the catch body 62. A threaded fastener 60, or other connector, is inserted from the back side of the front panel 36 into the threaded end ol the central bore 68 for securing the catch 60 to the front panel 36. The first end 64 of the catch body 62 seats against the front panel 36 and forms a seal to prevent air flow through the keyhole 40.

To remove a card module 30, the board extraction tool 50 is inserted into the tool-receiving opening 65 with the pins 56 on the board extraction tool 50 aligned with the insertion channels 72. The tool 50 is inserted until the pins 56 are aligned with the catch area 74 and then rotated to engage the pins 56 in the catch area 74. After the pin:s 56 are engaged in the catch area 74, the tool is pulled backward to pull the card module 30 out of the subrack 26.

While preferred embodiments of the present invention have been described, it will be appreciated by those of ordinary skill in the art that certain modifications may be made without departing from the scope of the present invention. All such modifications are intended to come within the scope of the claims which follow.

What is claimed is:

1. A card module comprising:
   a. a circuit board;
   b. a front panel having a front side and a backside secured along a front edge of said circuit board;
   c. a keyhole in said front panel adapted to receive a tool;
   d. a board extractor catch mounted over said keyhole to prevent air flow through said keyhole, said board extractor catch having first and second ends and being mounted to and extending outward from said front panel, said first end being disposed against said front panel and covering said keyhole; and
   e. a tool-receiving opening in said board extractor catch second end for releasably engaging a board removal tool.

2. The apparatus of claim 1, wherein said tool-receiving opening is formed in said second end.

3. The apparatus of claim 2, wherein the tool-receiving opening includes a central bore extending along an axis of the catch body and at least one slot extending radially outward from said central bore.

4. The apparatus of claim 3, wherein the slot includes an insertion channel extending generally parallel to said axis from the second end of said catch body, and a catch area extending from the insertion channel.

5. The apparatus of claim 3, wherein said central bore extends the entire length of said catch.

6. The apparatus of claim 5, wherein a portion of the central bore adjacent the first end is internally threaded to engage with a threaded fastener.

7. The apparatus of claim 1, further including a key disposed on the first end of the catch body engaging with the keyhole in the front panel of the card module to prevent rotation of the catch body.

8. The apparatus of claim 1, wherein the second end of the catch body includes an opening for engaging a board removal tool.

9. The apparatus of claim 8, wherein said fastener is a threaded fastener.

10. A card module comprising:

a. a circuit board;

b. a front panel secured along a front edge of said circuit board;

c. a keyhole in said front panel adapted to receive a board removal tool; and d. a board extractor catch to prevent air flow through said keyhole, said board extractor catch having first and second ends, said first end comprising a key extending outward to mount within said key hole to prevent rotation of said board extractor catch, and said second end comprising a tool-receiving opening to releasably engage the board removal tool.

* * * * *